(12) United States Patent
Saito et al.

(10) Patent No.: US 11,226,560 B2
(45) Date of Patent: Jan. 18, 2022

(54) PHOTOSENSITIVE RESIN COMPOSITION, CURED PATTERN PRODUCTION METHOD, CURED PRODUCT, INTERLAYER INSULATING FILM, COVER COAT LAYER, SURFACE PROTECTIVE LAYER, AND ELECTRONIC COMPONENT

(71) Applicant: HITACHI CHEMICAL DUPONT MICROSYSTEMS, LTD., Tokyo (JP)

(72) Inventors: Nobuyuki Saito, Hitachi (JP); Yukari Koibuchi, Hitachi (JP); Yutaka Namatame, Hitachi (JP)

(73) Assignee: HD MICROSYSTEMS, LTD., Tokyo (JP)

( * ) Notice: Subject to any disclaimer, the term of this patent is extended or adjusted under 35 U.S.C. 154(b) by 153 days.

(21) Appl. No.: 16/487,948

(22) PCT Filed: Feb. 22, 2018

(86) PCT No.: PCT/JP2018/006424
§ 371 (c)(1),
(2) Date: Aug. 22, 2019

(87) PCT Pub. No.: WO2018/155547
PCT Pub. Date: Aug. 30, 2018

(65) Prior Publication Data
US 2020/0041900 A1    Feb. 6, 2020

(51) Int. Cl.
*G03F 7/00*     (2006.01)
*G03F 7/037*    (2006.01)
(Continued)

(52) U.S. Cl.
CPC ......... *G03F 7/037* (2013.01); *C08G 73/1071* (2013.01); *G03F 7/0387* (2013.01);
(Continued)

(58) Field of Classification Search
CPC ....... C08G 7/1071; G03F 7/029; G03F 7/031; G03F 7/037; G03F 7/0387; G03F 7/162;
(Continued)

(56) References Cited

U.S. PATENT DOCUMENTS 6,485,886 B1 * 11/2002 Yamato ................. C07C 255/64
430/270.1
6,512,020 B1 * 1/2003 Asakura ................ C07C 309/00
522/57
(Continued)

FOREIGN PATENT DOCUMENTS

JP    2014-052592 A    3/2014
JP    2015-127817 A    7/2015
(Continued)

*Primary Examiner* — Sanza L. McClendon
(74) *Attorney, Agent, or Firm* — Fitch, Even, Tabin & Flannery, LLP

(57) ABSTRACT

A photosensitive resin composition comprising the following component (a), component (b1), and component (b2). (a) a polyimide precursor having a structural unit represented by the following formula (1); (b1) one or more compounds selected from the group consisting of a compound represented by the following formula (11) and a compound represented by the following formula (12); (b2) one or more compounds selected from the group consisting of a compound represented by the following formula (21) and a compound represented by the following formula (22).

(1)

(Continued)

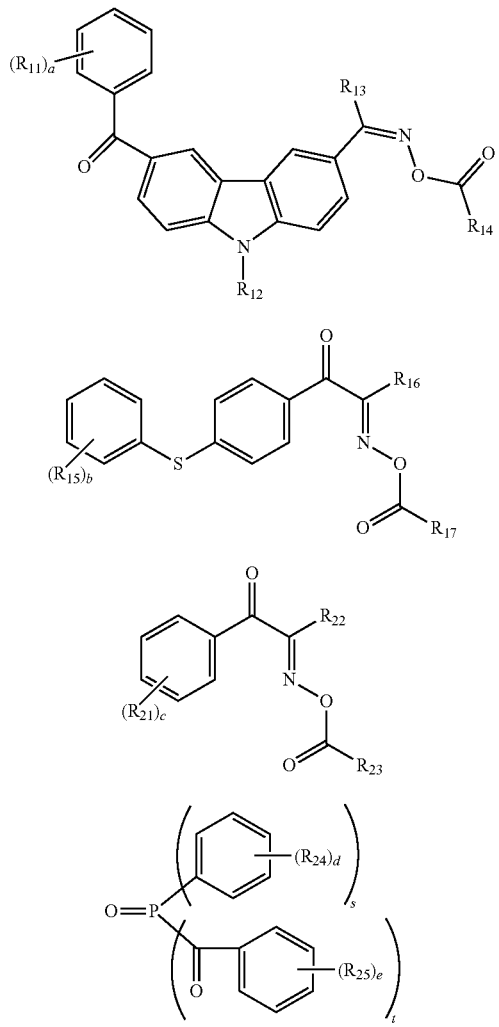

(51) Int. Cl.
*C08G 73/10* (2006.01)
*G03F 7/038* (2006.01)
*G03F 7/16* (2006.01)
*G03F 7/20* (2006.01)
*G03F 7/32* (2006.01)
*G03F 7/40* (2006.01)
*H01L 23/532* (2006.01)
*H01L 23/00* (2006.01)

(52) U.S. Cl.
CPC .............. *G03F 7/162* (2013.01); *G03F 7/168* (2013.01); *G03F 7/2004* (2013.01); *G03F 7/325* (2013.01); *G03F 7/40* (2013.01); *H01L 23/5329* (2013.01); *H01L 24/05* (2013.01); *H01L 2224/024* (2013.01)

(58) Field of Classification Search
CPC ........ G03F 7/168; G03F 7/2004; G03F 7/325; G03F 7/40; H01L 21/02118; H01L 21/0274; H01L 23/293; H01L 23/5329; H01L 24/05; H01L 2224/0235; H01L 2224/0236; H01L 2224/024; H01L 2224/05548; H01L 2224/13024; H01L 2224/13144
USPC .... 430/495.1, 494, 906, 913, 916, 926, 927; 522/164, 28, 56, 64, 65, 50
See application file for complete search history.

(56) References Cited

U.S. PATENT DOCUMENTS

| | | | |
|---|---|---|---|
| 7,026,094 B2* | 4/2006 | Matsumoto | C07D 333/36 430/270.1 |
| 8,148,045 B2* | 4/2012 | Murata | G03F 7/031 430/270.1 |
| 8,293,436 B2* | 10/2012 | Sasaki | C08F 2/50 430/7 |
| 8,349,548 B2* | 1/2013 | Matsumoto | C09B 55/008 430/325 |
| 8,586,268 B2* | 11/2013 | Matsumoto | G03F 7/031 430/7 |
| 8,759,989 B2* | 6/2014 | Matsumura | H01L 24/29 257/791 |
| 10,719,016 B2* | 7/2020 | Yorisue | H01L 21/02118 |
| 10,948,821 B2* | 3/2021 | Kiuchi | C08L 83/08 |

FOREIGN PATENT DOCUMENTS

| | | |
|---|---|---|
| JP | 2015-155199 A | 8/2015 |
| JP | 2016-008992 A | 1/2016 |
| JP | 2016-200643 A | 12/2016 |
| WO | 2015/125469 A1 | 8/2015 |

* cited by examiner

13 Claims, 1 Drawing Sheet

PHOTOSENSITIVE RESIN COMPOSITION, CURED PATTERN PRODUCTION METHOD, CURED PRODUCT, INTERLAYER INSULATING FILM, COVER COAT LAYER, SURFACE PROTECTIVE LAYER, AND ELECTRONIC COMPONENT

CROSS-REFERENCE TO RELATED APPLICATIONS

This application is a U.S. national phase application filed under 35 U.S.C. § 371 of International Application No. PCT/JP2018/006424, filed Feb. 22, 2018, designating the United States, which claims priority from Japanese Patent Application No. 2017-032368 filed Feb. 23, 2017, which is hereby incorporated herein by reference in its entirety.

TECHNICAL FIELD

The present disclosure relates to a photosensitive resin composition, a process for producing cured patterns, a cured product, an interlayer insulating film, a cover coat, a surface protective film, and an electronic component.

BACKGROUND ART

Conventionally, an organic material having high heat resistance such as polyimide resin has been widely applied as a protective film material of a semiconductor integrated circuit (LSI). A protective film (cured film) using such a polyimide resin is obtained by applying a polyimide precursor or a resin composition containing a polyimide precursor on a substrate, drying to form a resin film and curing the resin film by heating.

Along with the miniaturization and high-performance of electronic devices, the resin film is required to have a high resolution. There is also a need for a resin composition capable of forming a variety of pattern shape (pattern profiles).

In order to cope with high resolution, various proposals have been made for a photosensitive agent included in a resin composition, and a photosensitive agent having high sensitivity may be used in some cases (for example, Patent Document 1).

DOCUMENTS OF RELATED ART

Patent Documents

Patent Document 1: WO2015/125469

SUMMARY OF THE INVENTION

However, in the case of a photosensitive agent having high sensitivity, it is difficult to control the pattern shape because the pattern profile is largely changed by a slight increase or decrease in the addition amount. In addition, because of its high sensitivity, since the range of the optimal exposure dose is narrow and strict adjustment of the exposure dose is necessary at the time of exposure, the handleability is low.

An objective of the invention is to provide a photosensitive resin composition which is excellent in handleability and can easily control a pattern profile.

As a result of intensive studies by the present inventors, it has been found that by combining a specific high-sensitivity photosensitive agent with a specific standard-sensitivity photosensitive agent, the handleability of the photosensitive resin composition can be greatly improved and the control of the pattern profile can be facilitated, thereby completing the present invention.

According to the invention, the following photosensitive resin composition and the like are provided.

1. A photosensitive resin composition comprising the following component (a), component (b1), and component (b2):
(a) a polyimide precursor having a structural unit represented by the following formula (1)
(b1) one or more compounds selected from the group consisting of a compound represented by the following formula (11) and a compound represented by the following formula (12)
(b2) one or more compounds selected from the group consisting of a compound represented by the following formula (21) and a compound represented by the following formula (22)

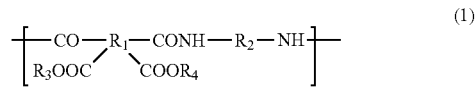

wherein in the formula (1), $R_1$ is a tetravalent organic group, $R_2$ is a divalent organic group, and $R_3$ and $R_4$ are independently a hydrogen atom, an alkyl group, a cycloalkyl group, or a monovalent organic group having a carbon-carbon unsaturated double bond;

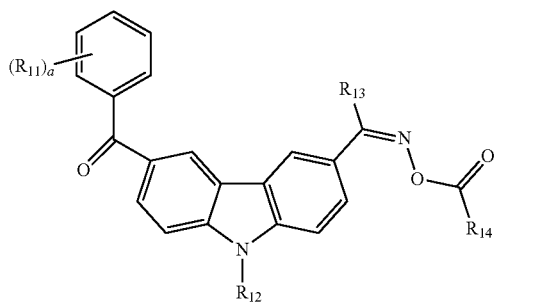

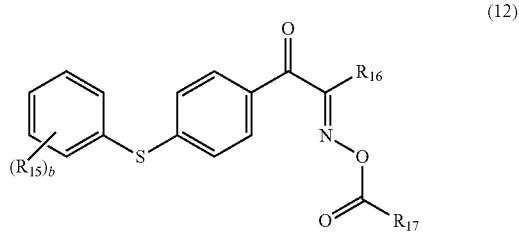

wherein in the formula (11), $R_{11}$ is an alkyl group having 1 to 12 carbon atoms, a is an integer of 0 to 5, $R_{12}$ is a hydrogen atom or an alkyl group having 1 to 12 carbon atoms, and $R_{13}$ and $R_{14}$ independently represent a hydrogen atom, an alkyl group having 1 to 12 carbon atoms, a phenyl group, or a tolyl group;
wherein in the formula (12), $R_{15}$ is —OH, —COOH, —O(CH$_2$)OH, —O(CH$_2$)$_2$OH, —COO(CH$_2$)OH, or —COO(CH$_2$)$_2$OH, $R_{16}$ and $R_{17}$ are independently a hydrogen atom, an alkyl group having 1 to 12 carbon atoms, a cycloalkyl group having 4 to 10 carbon atoms, a phenyl group, or a tolyl group, and b is an integer from 0 to 5;

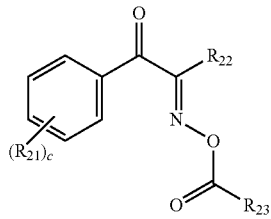

(21)

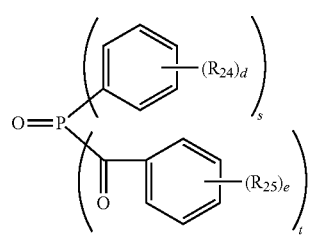

(22)

wherein in the formula (21), $R_{21}$ is an alkyl group having 1 to 12 carbon atoms, $R_{22}$ and $R_{23}$ are independently a hydrogen atom, an alkyl group having 1 to 12 carbon atoms, an alkoxy group having 1 to 12 carbon atoms, a cycloalkyl group having 4 to 10 carbon atoms, a phenyl group or a tolyl group, and c is an integer of 0 to 5;

wherein in the formula (22), $R_{24}$ and $R_{25}$ are independently an alkyl group having 1 to 12 carbon atoms, d and e are independently an integer of 0 to 5, s and t are independently an integer of 0 to 3, and the sum of s and t is 3.

2. The photosensitive resin composition according to 1, wherein the component (b1) is a compound represented by the formula (11) and the component (b2) is a compound represented by the formula (21).

3. The photosensitive resin composition according to 1 or 2, wherein the amount of the component (b1) is 0.05 to 5.0 parts by mass based on 100 parts by mass of the component (a) and the amount of the component (b2) is 0.5 to 10.0 parts by mass based on 100 parts by mass of the component (a).

4. The photosensitive resin composition according to any one of 1 to 3, wherein the amount of the component (b1) is 0.05 to 1.0 parts by mass based on 100 parts by mass of the component (a).

5. The photosensitive resin composition according to any one of 1 to 3, wherein the amount of the component (b1) is 0.15 to 0.60 parts by mass based on 100 parts by mass of the component (a).

6. The photosensitive resin composition according to any one of 1 to 5, wherein the amount of the component (b2) is 0.5 to 5.0 parts by mass based on 100 parts by mass of the component (a).

7. The photosensitive resin composition according to any one of 1 to 6, wherein the mass ratio of the amount of the component (b1) to the amount of the component (b2) is 1:3 to 1:30.

8. The photosensitive resin composition according to any one of 1 to 7, further comprising (d) a cross-linking agent.

9. The photosensitive resin composition according to any one of 1 to 8, further comprising (e) a sensitizer.

10. A method for manufacturing a cured pattern comprising:
applying the photosensitive resin composition according to any one of 1 to 9 on a substrate and drying to form a coating film, obtaining a resin pattern by irradiating the coating film with an active light and then developing the coating film,
heat-treating the resin pattern.

11. A cured product obtained by curing the photosensitive resin composition according to any one of 1 to 9.

12. An interlayer insulating film, a cover coat layer or a surface protective film manufactured by using the cured product according to 11.

13. An electronic component comprising the interlayer insulating film, the cover coat layer or the surface protective film according to 12.

According to the invention, a photosensitive resin composition which is excellent in handleability and can easily control a pattern profile can be provided.

MODE FOR CARRYING OUT THE INVENTION

Figure 1:
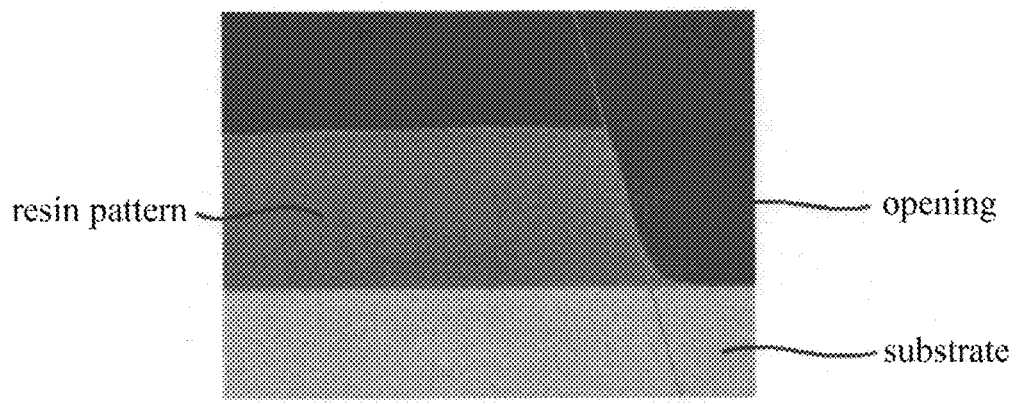
FIG. 1 is a scanning electron-micrograph of a cross-section of a resin pattern obtained using the photosensitive resin composition of Example 1.

Embodiments of the photosensitive resin composition, the process for manufacturing the cured pattern, the cured product, the interlayer insulating film, the cover coat layer, the surface protective film, and the electronic component will be described in detail below. The present invention is not limited to the following embodiments.

In the present specification, "A or B" may include either or both of A and B. As for the materials exemplified below, unless otherwise specified, one material may be used alone or two or more materials may be used in combination. Further, when a plurality of materials corresponding to each component exist in a composition, unless otherwise specified, a amount of each component in the composition herein means a total amount of the plurality of materials existing in the composition. In the present specification, the term "step" includes not only an independent step, but also a step if the intended action of the step is achieved even when the step is not clearly distinguishable from other steps. A numeric value range expressed by using "to" indicates the range including numeric values described before and after "to" as a minimum value and a maximum value, respectively. The term "(Meth)acryloxy" represents "methacryloxy" or "acryloxy," and the term "(meth)acrylate" represents "methacrylate" or "acrylate."

[Photosensitive Resin Composition]

The photosensitive resin composition of the invention comprises the following component (a), component (b1) and component (b2):

(a) a polyimide precursor having a structural unit represented by the following formula (1)

(b1) one or more compounds selected from the group consisting of a compound represented by the following formula (11) and a compound represented by the following formula (12)

(b2) one or more compounds selected from the group consisting of the compound represented by the following formula (21) and the compound represented by the following formula (22)

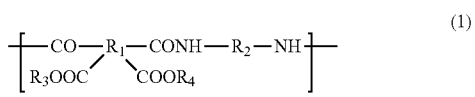

wherein in the formula (1), $R_1$ is a tetravalent organic group, $R_2$ is a divalent organic group, and $R_3$ and $R_4$ are independently a hydrogen atom, an alkyl group, a cycloalkyl group, or a monovalent organic group having a carbon-carbon unsaturated double bond;

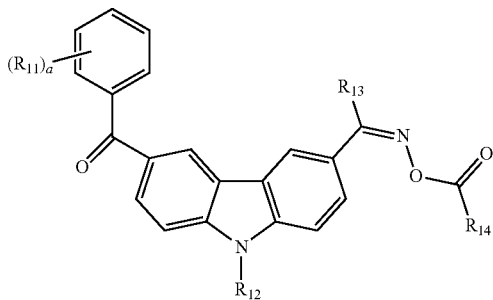

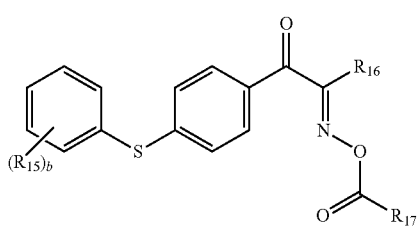

wherein in the formula (11), $R_{11}$ is an alkyl group having 1 to 12 carbon atoms, a is an integer of 0 to 5, $R_{12}$ is a hydrogen atom or an alkyl group having 1 to 12 carbon atoms, and $R_{13}$ and $R_{14}$ independently represent a hydrogen atom, an alkyl group having 1 to 12 carbon atoms, a phenyl group, or a tolyl group;

wherein in the formula (12), $R_{15}$ is —OH, —COOH, —O(CH$_2$)OH, —O(CH$_2$)$_2$OH, —COO(CH$_2$)OH, or —COO(CH$_2$)$_2$OH, $R_{16}$ and $R_{17}$ are independently a hydrogen atom, an alkyl group having 1 to 12 carbon atoms, a cycloalkyl group having 4 to 10 carbon atoms, a phenyl group, or a tolyl group, and b is an integer from 0 to 5;

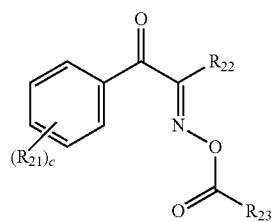

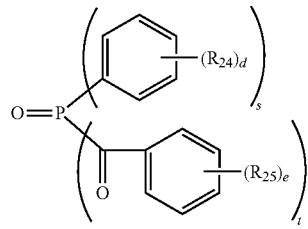

wherein in the formula (21), $R_{21}$ is an alkyl group having 1 to 12 carbon atoms, $R_{22}$ and $R_{23}$ are independently a hydrogen atom, an alkyl group having 1 to 12 carbon atoms, an alkoxy group having 1 to 12 carbon atoms, a cycloalkyl group having 4 to 10 carbon atoms, a phenyl group or a tolyl group, and c is an integer of 0 to 5;

wherein in the formula (22), $R_{24}$ and $R_{25}$ are independently an alkyl group having 1 to 12 carbon atoms, d and e are independently an integer of 0 to 5, s and t are independently an integer of 0 to 3, and the sum of s and t is 3.

The photosensitive resin composition of the invention is preferably a negative photosensitive resin composition.

By combining a specific high-sensitivity photosensitive agent with a specific standard-sensitivity photosensitive agent, the photosensitive resin composition of the invention can greatly expand the applicable range (margins) of exposure dose, i.e., greatly improve handleability, as compared to using only a high-sensitivity photosensitive agent. In addition, as compared with the case where only a standard-sensitivity photosensitive agent is used, the total number of parts of the photosensitive agent to be added can be suppressed, thereby reducing the generation of outgas and further reducing the cost.

In addition, in the photosensitive resin composition of the invention, the pattern profile changes gradually with increasing or decreasing amounts of the photosensitive agent, so that a desired pattern profile can be easily obtained.

Hereinafter, each component used in the present invention will be described.

(Component (a))

The component (a) is a polyimide precursor having a structural unit represented by the following formula (1),

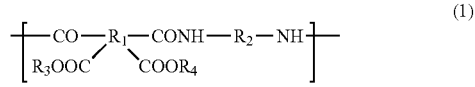

wherein in the formula (1), $R_1$ is a tetravalent organic group, $R_2$ is a divalent organic group, and $R_3$ and $R_4$ are independently a hydrogen atom, an alkyl group, a cycloalkyl group, or a monovalent organic group having a carbon-carbon unsaturated double bond.

The $R_1$ in the formula (1) is a structure derived from a tetracarboxylic acid or a dianhydride thereof used as a raw material. As a raw material corresponding to the $R_1$, a known material can be used without any particular limitation.

The tetravalent organic group of the $R_1$ is preferably any one of the groups represented by the following formulas (2a) to (2e) from the viewpoint of reducing the stresses of cured film. These may be used alone or in combination of two or more kinds.

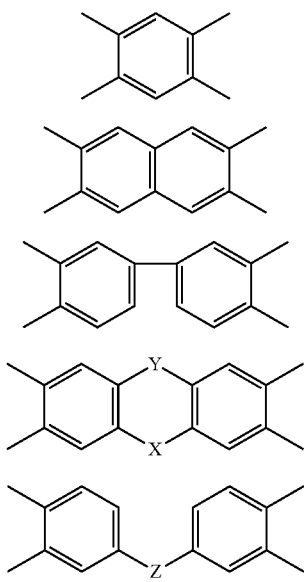

(2a)

(2b)

(2c)

(2d)

(2e)

In the formula (2d), X and Y independently represent a divalent group which is not conjugated to a benzene ring bonded thereto, or a single bond;

in the formula (2e), Z is an ether bond (—O—) or a sulfide bond (—S—).

The "divalent group which is not conjugated to a benzene ring bonded thereto" of X and Y of the formula (2d) is, for example, —O—, —S—, or a divalent group represented by the following formula.

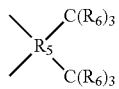

In the formula, $R_5$ is a carbon atom or a silicon atom, and Re is independently a hydrogen atom or a halogen atom such as a fluorine atom.

Among these groups represented by the formulas (2a) to (2e), the group represented by the formula (2e) is more preferable.

Raw materials corresponding to the $R_1$ are 3,3',4,4'-benzophenone tetracarboxylic dianhydride, 1,2,5,6-naphthalenetetracarboxylic dianhydride, 2,3,5,6-pyridinetetracarboxylic dianhydride, 1,4,5,8-naphthalenetetracarboxylic dianhydride, 3,4,9,10-perylenetetracarboxylic dianhydride, m-terphenyl-3,3',4,4'-tetracarboxylic dianhydride, p-terphenyl-3,3',4,4'-tetracarboxylic dianhydride, 1,1,1,3,3,3-hexafluoro-2,2-bis(2,3-dicarboxyphenyl)propane dianhydride, and 1,1,1,3,3,3-hexafluoro-2,2-bis(3,4-dicarboxyphenyl)propane dianhydride, 2,2-bis(2,3-dicarboxyphenyl)propane dianhydride, 2,2-bis(3,4-dicarboxyphenyl)propane dianhydride, 2,2-bis{4'-(2,3-dicarboxyphenoxy)phenyl}propane dianhydride, 2,2-bis{4'-(3,4-dicarboxyphenoxy)phenyl}propane dianhydride, 1,1,1,3,3,3-hexafluoro-2,2-bis{4'-(2,3-dicarboxyphenoxy)phenyl}propane dianhydride, 1,1,1,3,3,3-hexafluoro-2,2-bis{4'-(3,4-dicarboxyphenoxy)phenyl}propane dianhydride, 4,4'-dioxydiphthalic acid dianhydride, 4,4'-sulfonyldiphthalic acid dianhydride, and the like may be used.

The $R_2$ in the formula (1) is a structure derived from a diamine compound used as a raw material.

The divalent organic group of the $R_2$ is preferably a divalent organic group represented by the following formula (5) from the viewpoint of i-line transmittance.

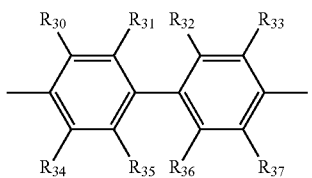

(5)

In the formula (5), each of $R_{30}$ to $R_{37}$ is independently a hydrogen atom, a fluorine atom, or a monovalent organic group, and at least one of $R_{30}$ to $R_{37}$ is a fluorine atom or a monovalent organic group.

Examples of the monovalent organic group of $R_{30}$ to $R_{37}$ include an alkyl group having 1 to 10 carbon atoms (preferably 1 to 6 carbon atoms) (e.g., a methyl group), a fluorinated alkyl group having 1 to 10 carbon atoms (preferably 1 to 6 carbon atoms) (e.g., a trifluoromethyl group), and the like.

The divalent organic group of the $R_2$ is more preferably a divalent organic group represented by the formula (6) from the viewpoint of i-line transmittance and availability.

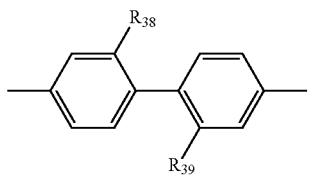

(6)

In the formula (6), each of $R_{38}$ and $R_{39}$ is independently a fluorine atom, a methyl group, or a trifluoromethyl group.

In the polyimide precursor having the structural unit represented by the formula (1), the ratio of the structural unit in which the $R_2$ is the divalent organic group represented by the formula (5) or the formula (6) based on all the structural units represented by the formula (1) may be 1 to 100 mol %, 10 to 100 mol %, or 30 to 100 mol %.

When the $R_2$ is a divalent organic group represented by the formula (5) or (6), raw materials include 2,2'-dimethylbenzidine, 2,2'-bis(trifluoromethyl)-4,4'-diaminobiphenyl, 2,2'-bis(fluoro)-4,4'-diaminobiphenyl, 4,4'-diaminooctafluorobiphenyl, and the like.

When the $R_2$ is a divalent organic group other than the divalent organic group represented by the formula (5) or (6), a corresponding diamine compound may be used. As examples of such diamine compound, for example, p-phenylenediamine, m-phenylenediamine, p-xylylenediamine, m-xylylenediamine, 1,5-diaminonaphthalene, benzidine, 4,4'-diaminodiphenyl ether, 3,4'-diaminodiphenyl ether, 3,3'-diaminodiphenyl ether, 2,4'-diaminodiphenyl ether, 2,2'-diaminodiphenyl ether, 4,4'-diaminodiphenyl sulfone, 3,4'-diaminodiphenyl sulfone, 3,3'-diaminodiphenyl sulfone, 2,4'-diaminodiphenyl sulfone, 2,2'-diaminodiphenyl sulfone, 4,4'-diaminodiphenyl sulfide, 3,4'-diaminodiphenyl sulfide, 3,3'-diaminodiphenyl sulfide, 2,4'-diaminodiphenyl sulfide, 2,2'-diaminodiphenyl sulfide, o-tridine, o-tridine sulfone, 4,4'-methylene-bis(2,6-diethylaniline), 4,4'-methylene-bis(2,6-diisopropylaniline), 2,4-diaminomesitylene, 1,5-diaminonaphthalene, 4,4'-benzophenodiamine, bis-{4-(4'-aminophenoxy)phenyl}sulfone, 2,2-bis{4(4'-aminophenoxy)phenyl}propane, 3,3'-dimethyl-4,4'-diaminodiphenylmethane, 3,3',5,5'-tetramethyl-4,4'-diaminodiphenylmethane, bis{4-(3'-aminophenoxy)phenyl}sulfone, 2,2-bis(4-aminophenyl)propane, diaminopolysiloxane, and the like can be given. The above-mentioned diamine compound may be used alone or in combination of two or more kinds.

In the polyimide precursor having the structural unit represented by the formula (1), the ratio of the structural unit in which the $R_2$ is a divalent organic group other than the divalent organic group represented by the formula (5) or (6) based on all the structural units represented by the formula (1) may be 1 to 100 mol %, 10 to 100 mol %, or 30 to 100 mol %.

$R_3$ and $R_4$ in the formula (1) are independently a hydrogen atom, an alkyl group, a cycloalkyl group, or a monovalent organic group having a carbon-carbon unsaturated double bond.

The alkyl group (preferably having 1 to 20 carbon atoms, more preferably having 1 to 10 carbon atoms, and more preferably having 1 to 6 carbon atoms) includes a methyl group, an ethyl group, an n-propyl group, a 2-propyl group, an n-butyl group, an n-hexyl group, an n-heptyl group, an n-decyl group, an n-dodecyl group, and the like.

The cycloalkyl group (preferably having 3 to 20 carbon atoms, more preferably having 5 to 15 carbon atoms, and still more preferably having 6 to 12 carbon atoms) include a cyclopropyl group, a cyclobutyl group, a cyclopentyl group, a cyclohexyl group, an adamantyl group, and the like.

Examples of the monovalent organic group having a carbon-carbon unsaturated double bond include (meth)acryloxyalkyl groups having 1 to 10 carbon atoms, and the like.

Examples of the (meth)acryloxyalkyl group having 1 to 10 carbon atoms include (meth)acryloxyethyl group, (meth)acryloxypropyl group, (meth)acryloxybutyl group, and the like.

Preferably, at least one of the $R_3$ and the $R_4$ is an organic group having a carbon-carbon unsaturated double bond.

The molecular weight of the polyimide precursor represented by the formula (1) is preferably 10,000 to 100,000, more preferably 15,000 to 100,000, and still more preferably 20,000 to 85,000 in weight-average molecular weight in terms of polystyrene. When the weight-average molecular weight is 10,000 or more, the stress after curing can be sufficiently reduced. When it is 100,000 or less, the solubility in the solvent is further improved, and the viscosity of the solution is reduced, so that the handleability can be further improved. The weight-average molecular weight can be measured by a gel permeation chromatography method, and can be obtained by conversion using a standard polystyrene calibration curve.

The component (a) used in the invention can be synthesized by a known method, and, for example, can be synthesized by addition polymerization of a tetracarboxylic dianhydride and a diamine compound. The molar ratio of the tetracarboxylic dianhydride to the diamine compound is usually 1.0, but may be in the range of 0.7 to 1.3 for the purpose of controlling molecular weight and terminal residues. When the molar ratio is 0.7 to 1.3, the molecular weight of the obtained polyimide precursor can be made to be equal to or higher than a certain value, and low stresses after curing can be sufficiently exhibited.

(a) The amount of polyimide precursor may be 20 to 60% by mass, 25 to 55% by mass, or 30 to 55% by mass in the photosensitive resin composition.

(Component (b1))

The component (b1) and the component (b2) described later are photosensitive agents, and usually, radicals are generated by irradiation with active light. The component (b1) is, for example, a high-sensitivity photosensitive agent having higher sensitivity to active light than the component (b2) described later.

The component (b1) is one or more compounds selected from the group consisting of compounds represented by the following formula (11) and the following formula (12).

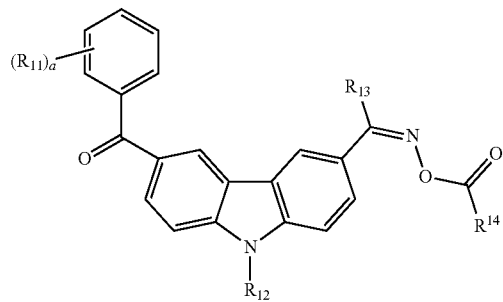

(11)

In the formula (11), $R_{11}$ is an alkyl group having 1 to 12 carbon atoms, and a is an integer of 0 to 5; $R_{12}$ is a hydrogen atom or an alkyl group having 1 to 12 carbon atoms; $R_{13}$ and $R_{14}$ are independently a hydrogen atom, an alkyl group having 1 to 12 carbon atoms (preferably 1 to 4 carbon atoms), a phenyl group, or a tolyl group. When a is an integer of 2 or more, each $R_{11}$ may be the same or different.

$R_{11}$ is preferably an alkyl group having 1 to 4 carbon atoms, more preferably a methyl group. a is preferably 1. $R_{12}$ is preferably an alkyl group having 1 to 4 carbon atoms, more preferably an ethyl group. $R_{13}$ and $R_{14}$ are preferably independently an alkyl group having 1 to 4 carbon atoms, more preferably a methyl group.

The compound represented by the formula (11) includes, for example, a compound represented by the following formula (11-1), and is available as "IRGACURE OXE 02" manufactured by BASF Japan Ltd.

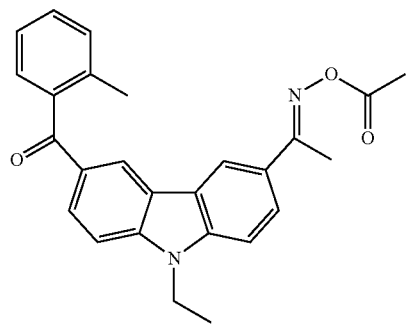

(11-1)

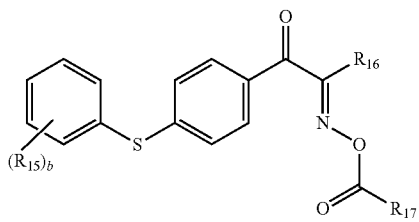

(12)

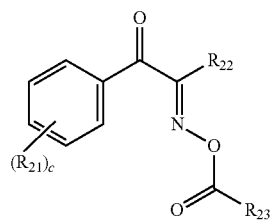

(21)

In the formula (12), $R_{15}$ is —OH, —COOH, —O(CH$_2$)OH, —O(CH$_2$)$_2$OH, —COO(CH$_2$)OH, or —COO(CH$_2$)$_2$OH, and $R_{16}$ and $R_{17}$ are independently a hydrogen atom, an alkyl group having 1 to 12 carbon atoms (preferably 1 to 6 carbon atoms), a cycloalkyl group having 4 to 10 carbon atoms, a phenyl group, or a tolyl group; b is an integer from 0 to 5; when b is an integer of 2 or more, each $R_{15}$ may be the same or different.

$R_{15}$ is preferably -O(CH$_2$)$_2$OH. b is preferably 0 or 1. $R_{16}$ is preferably an alkyl group having 1 to 6 carbon atoms, more preferably a methyl group or a hexyl group. $R_{17}$ is preferably an alkyl group or a phenyl group having 1 to 6 carbon atoms, more preferably a methyl group or a phenyl group.

The compound represented by the formula (12) includes, for example, a compound represented by the following formula (12-1), which is available as "IRGACURE OXE 01" manufactured by BASF Japan Ltd. In addition, the compound represented by the formula (12) also includes a compound represented by the following formula (12-2), which is available as "NCI-930" manufactured by ADEKA CORPORATION.

(12-1)

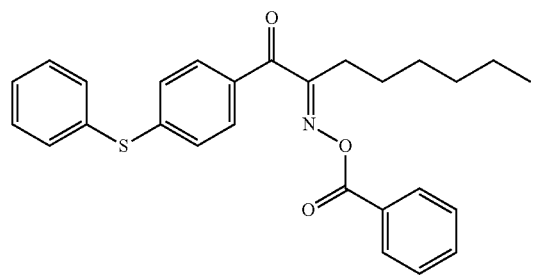

(12-2)

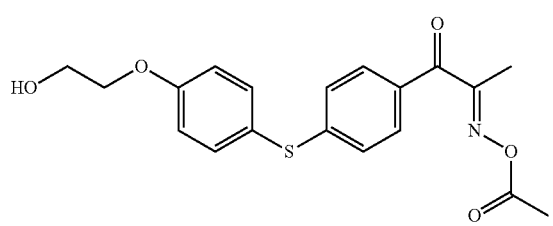

(Component (b2))

The component (b2) is, for example, a standard-sensitivity photosensitive agent which is less sensitive to active light than the component (b1). The component (b2) is one or more compounds selected from the group consisting of the compounds represented by the following formula (21) and the following formula (22).

In the formula (21), $R_{21}$ is an alkyl group having 1 to 12 carbon atoms, $R_{22}$ and $R_{23}$ are independently a hydrogen atom, an alkyl group having 1 to 12 carbon atoms (preferably 1 to 4 carbon atoms), an alkoxy group having 1 to 12 carbon atoms (preferably 1 to 4 carbon atoms), a cycloalkyl group having 4 to 10 carbon atoms, a phenyl group or a tolyl group, and c is an integer of 0 to 5. When c is an integer of 2 or more, each $R_{21}$ may be the same or different.

c is preferably 0. $R_{22}$ is preferably an alkyl group having 1 to 4 carbon atoms, more preferably a methyl group. $R_{23}$ is preferably an alkoxy group having 1 to 12 carbon atoms, more preferably an alkoxy group having 1 to 4 carbon atoms, and more preferably a methoxy group or an ethoxy group.

The compound represented by the formula (21) includes, for example, a compound represented by the following formula (21-1), and is available as "G-1820 (PDO)" manufactured by Lambson Ltd.

(21-1)

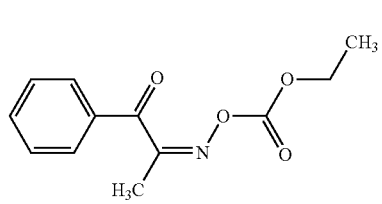

(22)

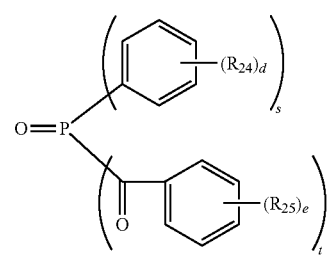

In the formula (22), each of $R_{24}$ and $R_{25}$ is independently an alkyl group having 1 to 12 carbon atoms (preferably 1 to 4 carbon atoms), d and e are independently an integer of 0 to 5, s and t are independently an integer of 0 to 3, and the sum of s and t is 3; when d is an integer of 2 or more, each $R_{24}$ may be the same or different; when e is an integer of 2 or more, each $R_{25}$ may be the same or different; when s is an integer of 2 or more, the groups in parentheses may be the same or different. When t is an integer of 2 or more, the groups in parentheses may be the same or different.

d is preferably 0. $R_{25}$ is preferably independently an alkyl group having 1 to 4 carbon atoms, preferably a methyl group. e is preferably an integer from 2 to 4, more preferably 3. The combination of s and t (s, t) is preferably (1, 2) or (2, 1).

The compound represented by the formula (22) includes, for example, a compound represented by the following formula (22-1), and is available as "IRGACURE TPO" manufactured by BASF Japan Ltd. The compound represented by the formula (22) also includes a compound represented by the following formula (22-2) can be cited and available as "IRGACURE BAPO" manufactured by BASF Japan Ltd.

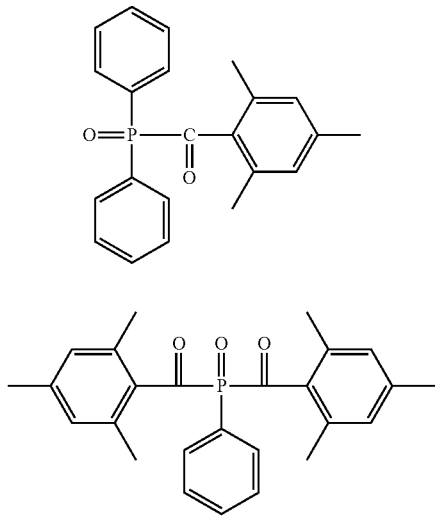

(22-1)

(22-2)

It is preferable to use the compound represented by the above formula (11) as the component (b1) and to use the compound represented by the above formula (21) as the component (b2).

The amount of the component (b1) in the photosensitive resin composition of the invention is usually 0.05 to 5.0 parts by mass, preferably 0.05 to 1.0 parts by mass, more preferably 0.15 to 0.6 parts by mass, based on 100 parts by mass of the component (a).

The amount of the component (b2) in the photosensitive resin composition of the invention is usually 0.5 to 10.0 parts by mass, preferably 0.5 to 5.0 parts by mass, based on 100 parts by mass of the component (a).

It is preferable that the amount of the component (b1) is 0.05 to 5.00 parts by mass based on 100 parts by mass of the component (a), and the amount of the component (b2) is 0.5 to 10.0 parts by mass based on 100 parts by mass of the component (a).

The mass ratio of the amounts of the component (b1) and the component (b2) is preferably 1:3 to 1:30, more preferably 1:5 to 1:20.

The total amount of the components (b1) and (b2) in the photosensitive resin composition of the invention is preferably 0.6 to 11.0 parts by mass, more preferably 1.0 to 5.0 parts by mass, and still more preferably 1.15 to 4.6 parts by mass based on 100 parts by mass of the component (a).

For example, 70% by mass or more, 80% by mass or more, 90% by mass or more, 95% by mass or more, 99% by mass or more, 99.5% by mass or more, or 99.9% by mass or more of the photosensitive resin composition of the invention may be components (a), (b1), (b2) and component (c) (solvent) described later, or may be components (a), (b1), (b2) and, (c), as well as one or more components selected from other arbitrary component described later.

The photosensitive resin composition of the invention may consist essentially of components (a), (b1), (b2) and (c), or may consist essentially of components (a), (b1), (b2) and (c), and one or more components selected from other arbitrary components described below. In this case, an unavoidable impurity may be included.

The photosensitive resin composition of the invention may consist of components (a), (b1), (b2) and (c), or may consist of components (a), (b1), (b2) and (c), as well as one or more components selected from other arbitrary components described below.

(Arbitrary Component)

In addition to the above components, the photosensitive resin composition of the invention may optionally include arbitrary component. The arbitrary component includes a solvent (component (c)), a crosslinking agent (component (d)), a sensitizer (component (e)), an organosilane compound (component (f)), other components, and the like.

(Component (c))

The component (c) are not particularly limited as long as they can sufficiently dissolve the components in the photosensitive resin composition. A polar solvent which sufficiently dissolves polyimide precursor of the component (a) is preferable. Examples of the polar solvent include N-methyl-2-pyrrolidone (NMP), N,N-dimethylacetamide, N,N-dimethylformamide, dimethyl sulfoxide, tetramethylurea, hexamethylphosphate triamide, γ-butyrolactone, δ-valerolactone, γ-valerolactone, cyclohexanone, cyclopentanone, propylene glycol monomethyl ether acetate, propylene carbonate, ethyl lactate, 1,3-dimethyl-2-imidazolidinone, and the like.

The amount of the component (c) in the photosensitive resin composition of the invention is not particularly limited, but is preferably 50 to 300 parts by mass, more preferably 50 to 250 parts by mass, and still more preferably 100 to 200 parts by mass based on 100 parts by mass of the component (a).

(Component (d))

Examples of the cross-linking agent (different from (f) organosilane compound described below) includes diethylene glycol di(meth)acrylate, triethylene glycol di(meth)acrylate, tetraethylene glycol di(meth)acrylate, trimethylol propane di(meth)acrylate, trimethylol propane tri(meth)acrylate, 1,4-butanediol di(meth)acrylate, 1,6-hexanediol di(meth)acrylate, pentaerythritol tri(meth)acrylate, pentaerythritol tetra(meth)acrylate, ethoxylated pentaerythritol tetra(meth)acrylate, styrene, divinylbenzene, 4-vinyltoluene, 4-vinylpyridine, N-vinylpyrrolidone, 2-hydroxyethyl (meth)acrylate, 1,3-(meth)acryloyloxy-2-hydroxypropane, methylenebisacrylamide, N,N-dimethylacrylamide, N-methylolacrylamide, and the like.

When the cross-linking agent is contained, the amount of the cross-linking agent is preferably 1 to 100 parts by mass, more preferably 1 to 75 parts by mass, and more preferably 1 to 50 parts by mass based on 100 parts by mass of the component (a).

(Component (e))

Examples of the sensitizer includes, for example, 7-N,N-diethylaminocumarin, 7-diethylamino-3-tenonyl coumarin, 3,3'-carbonylbis(7-N,N-diethylamino)coumarin, 3,3'-carbonylbis(7-N,N-dimethoxy)coumarin, 3-thienylcarbonyl-7-N,N-diethylaminocumanne, 3-benzoylcoumarin, 3-benzoyl-7-N,N-methoxycumarin, 3-(4'-methoxybenzoyl)coumarin, 3,3'-carbonylbis-5,7-(dimethoxy)coumarin, benzalacetophenone, 4'-N,N-dimethylaminobenzalacetophenone, 4'-acetaminobenzal-4-methoxyacetophenone, dimethylaminobenzophenone, diethylaminobenzophenone, 4,4'-bis(N-ethyl, N-methyl)benzophenone, 4,4'-bis(diethylamino) benzophenone, and the like.

When the sensitizer is contained, the amount is more preferably 0.1 to 3.0 parts by mass, more preferably 0.1 to 1.0 parts by mass, based on 100 parts by mass of (a) polyimide precursor.

(Component (f))

Examples of the organosilane compound include γ-aminopropyltrimethoxysilane, γ-aminopropyltriethoxysilane, vinyltriethoxysilane, vinyltrimethoxysilane, γ-glycidoxypropyltriethoxysilane, γ-glycidoxypropyltrimethoxysilane, γ-methacryloxypropyltrimethoxysilane, γ-acryloxypropyltrimethoxysilane, γ-ureidopropyltriethoxysilane, 3-mercaptopropyltrimethoxysilane, 3-isocyanatepropyltriethoxysilane, bis(2-hydroxyethyl)-3-aminopropyltriethoxysilane, triethoxysilylpropylethylcarbamate, 3-(triethoxysilyl)propylsuccinic acid anhydride, phenyltriethoxysilane, phenyltrimethoxysilane, N-phenyl-3-aminopropyltrimethoxysilane, 3-triethoxysilyl-N-(1,3-dimethylbutylidene)propylamine, 2-(3,4-epoxycyclohexyl)ethyltrimethoxysilane, and the like.

When the organosilane compound is contained, the adhesion of the photosensitive resin composition to the cured substrates can be improved.

When the organic silane compound is contained, the amount of the organosilane compound is more preferably 0.5 to 15 parts by mass, still more preferably 0.5 to 10 parts by mass, based on 100 parts by mass of the component (a).

(Other Component)

The photosensitive resin composition of the invention may contain a rust preventive agent from the viewpoint of further improving the rust preventive property. Examples of the rust preventive agent includes 5-amino-1H-tetrazole, 1-methyl-5-amino-tetrazole, 1-methyl-5-mercapto-1H-tetrazole, 1-carboxymethyl-5-amino-tetrazole, and the like. These tetrazole compounds may be water-soluble salts thereof.

When the rust preventive agent is contained, the amount is preferably 0.05 to 5.0 parts by mass, more preferably 0.5 to 4.0 parts by mass based on 100 parts by mass of the component (a).

The photosensitive resin composition of the invention may also contain a stabilizer. As the stabilizer, known compounds such as 1,4,4-trimethyl-2,3-diazabicyclo[3.2.2]-nona-2-ene-N,N-dixoid can be used.

When the stabilizer is contained, the amount is preferably 0.05 to 5.0 parts by mass, more preferably 0.1 to 2.0 parts by mass, based on 100 parts by mass of the component (a).

[Cured Product]

The cured product of the invention can be obtained by curing the above-mentioned photosensitive resin composition. The cured product of the invention may be used as a pattern cured film or as a cured film without a pattern.

The thickness of the cured product of the invention is preferably 1 to 20 μm.

The manufacturing process of the cured pattern of the present invention includes a step of applying a photosensitive resin composition of the present invention on a substrate and drying to form a coating film (coating film forming step), a step of irradiating the formed coating film with an active light (exposure step), a step of developing it to obtain a resin pattern (development step), and a step of heat-treating the resin pattern (heat-treating step).

In the coating film forming step, the photosensitive resin composition is applied onto the substrate by an immersion method, a spraying method, a screen-printing method, a spin-coating method, or the like.

Examples of the substrate include a silicon wafer, a metal substrate, a ceramic substrate, and the like.

After the photosensitive resin composition is applied onto the substrate, the solvent is removed (dried) by heat, whereby a coating film (photosensitive resin film) having low tackiness can be formed.

The heating temperature at the time of drying is preferably 80 to 130° C., and the drying time is preferably 30 to 300 seconds. The drying is preferably performed using a device such as a hot plate.

In the exposure step, exposure is performed by irradiating the obtained coating film with active light through a mask on which a desired pattern is drawn.

Although the photosensitive resin composition of the invention is suitable for i-line exposure, ultraviolet rays, deep ultraviolet rays, visible rays, electron-rays, X-rays, or the like can be used as the active light to be irradiated.

After the exposure step, in the development step, an unexposed portion is dissolved and removed with an appropriate developer, whereby a desired pattern can be obtained.

The developer is not particularly limited, but a flame retardant solvent such as 1,1,1-trichloroethane; a good solvent such as N,N-dimethylformamide, dimethylsulfoxide, N,N-dimethylacetamide, N-methyl-2-pyrrolidone, cyclopentanone, γ-butyrolactone, and acetate esters; and a mixed solvent of these good solvents and a poor solvent such as a lower alcohol, water, or aromatic hydrocarbon is used. After development, rinsing with a poor solvent (e.g., water, ethanol, 2-propanol, PGMEA (propylene glycol 1-monomethyl ether 2-acetate)) or the like is performed as required.

The heating temperature in the heat-treating step is preferably 250° C. or less, more preferably 230° C. or less. The duration of the heat-treating is preferably 20 minutes to 6 hours, more preferably 30 minutes to 3 hours.

The cured pattern of the present invention preferably has a thickness of 1 μm or more, and more preferably 5 μm or more for use as a protective film, and usually 20 μm or less.

[Applications of Cured Product]

The cured product of the invention can be used as an interlayer insulating film, a cover coat layer, a surface protective film, a rewiring layer, or the like. The interlayer insulating film, the cover coat layer, the surface protective film, and the rewiring layer can be used for electronic component. Thus, an electronic component with high reliability can be obtained.

The electronic component of the present invention can be used for a semiconductor device, a multilayer wiring board, or the like. The semiconductor device and the multilayer wiring board can be used for various electronic devices and the like.

The electronic component of the invention is not particularly limited except for having one or more selected from the above-mentioned interlayer insulating film, cover coat layer, surface protective film, and rewiring layer, and can have various structures.

Figure 2:
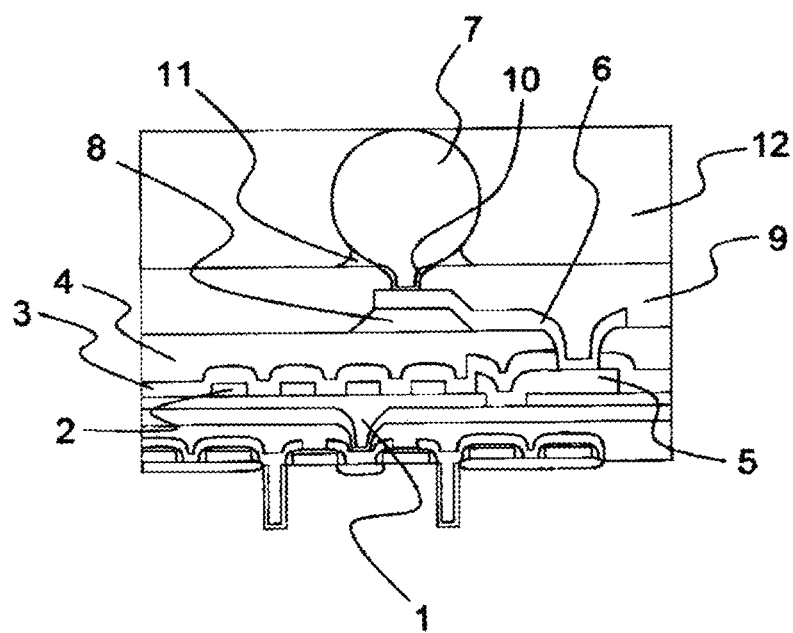
FIG. 2 is a schematic cross-sectional view of a semiconductor device having a interlayer insulating film, a cover coat layer, and a surface protective film according to an embodiment of the invention.

FIG. 2 is a schematic cross-sectional view of a semiconductor device having a interlayer insulating film, a cover coat layer, and a surface protective film according to the present invention. An Al wiring layer 2 is formed on the interlayer insulating layer (interlayer insulating film) 1, and an insulating layer (insulating film) 3 (e.g., a P—SiN layer) is formed on the top thereof, and a surface protective layer (surface protective film) 4 of the device is formed. A rewiring layer 6 is formed from the pad portion 5 of the Al wiring layer 2, and extends to an upper portion of the core 8, which is a connection portion with the conductive ball 7 formed of solder, gold, or the like, which is an external connection terminal. Further, a cover coat layer 9 is formed on the surface protective layer 4. The rewiring layer 6 is connected to a conductive ball 7 via a barrier metal 10, and a collar 11 is provided to hold the conductive ball 7. When mounting a package of such a structure, the underfill 12 may be interposed in order to further relieve the stress.

EXAMPLES

Hereinafter, the present invention will be described in more detail using examples and comparative examples, but the present invention is not limited to these examples.

Production Example 1

Synthesis of Polymer I 31.02 g (100 mmol) of 4,4'-oxydiphthalic acid dianhydride (ODPA), 26.03 g (100 mmol) of 2-hydroxyethylmethacrylate (HEMA), 0.1 g of hydroquinone and catalytic amounts of DBU (diazabicycloundecene) were dissolved in 118 g of NMP and stirred at room temperature for 48 hours to obtain ester (ODPA-HEMA ester) solutions.

While the ODPA-HEMA ester solution was cooled in an ice bath, 26.17 g (220 mmol) of thionyl chloride was added dropwise so that the temperature of the reaction solution did not exceed 10° C., and the reaction solution was stirred for 1 hour to prepare an acid chloride solution.

Separately, a solution of 21.23 g (100 mmol) of 2,2'-dimethylbenzidine (DMAP), 34.80 g (440 mmol) of pyridine, and 0.8 g of hydroquinone in 85 g of NMP was prepared, and dropwise added to the previously prepared acid chloride solution while cooled in an ice bath so that the temperature of the reaction solution did not exceed 10° C.

After completion of the dropwise addition, the reaction solution was dropwise added to distilled water, and a precipitate formed was collected by filtration, washed several times with distilled water, and then dried in a vacuum to obtain a polyamic acid ester (Polymer I). The weight-average molecular weight of Polymer 1 was 35,000.

The weight-average molecular weight of Polymer 1 was determined by the GPC method in terms of standard polystyrene, and was measured under the following conditions.

A solution of 1 mL of solvent [tetrahydrofuran (THF)/N,N-dimethylformamide (DMF)=1/1 (volume ratio)] was used for Polymer 1 (0.5 mg).

Measuring Equipment: Detector RID-20AD manufactured by Shimadzu Corporation
Pumps: LC-20AD manufactured by Shimadzu Corporation
C-R4A Chromatopac manufactured by Shimadzu Corporation
Measuring conditions: column: Gelpack GL-S300MDT-5×2
Eluent: THF/DMF=1/1 (volume ratio)
LiBr (0.03 mol/L), $H_3PO_4$ (0.06 mol/L)
Flow rate: 1.0 mL/min, Detector: UV 270 nm Production Example 2

Synthesis of Polymer II

In a 1.0 L flask equipped with a stirrer and thermometer, 62.0 g (199.9 mmol) of ODPA, 5.2 g (40.0 mmol) of HEMA and catalytic amounts of 1,4-diazabicyclo[2.2.2.]octane (triethylenediamine) were dissolved in 250.0 g NMP, stirred at 45° C. for 1 hour, cooled to 25° C., and 5.5 g (50.9 mmol) of m-phenylenediamine, 23.8 g (118.9 mmol) of oxydianiline (4,4'-diaminodiphenyl ether) and 100 mL of dried NMP were added, followed by stirring at 45° C. for 150 minutes, and then cooled to room temperature. To this solution, 78.5 g (373.8 mmol) of trifluoroacetic acid anhydride was added dropwise, followed by stirring for 20 minutes, followed by addition of 53.1 g (408.0 mmol) of HEMA and stirring at 45° C. for 20 hours. The reaction solution was added dropwise to distilled water, and the precipitate was collected by filtration and dried under reduced pressure to obtain a polyamic acid ester (Polymer II).

The weight-average molecular weight of Polymer II was 35,000.

The weight-average molecular weight of Polymer II was determined by the GPC method in terms of standard polystyrene, and was measured under the same conditions as in Production Example 1.

Examples 1 to 17 and Comparative Examples 1 to 6

Preparation of the Photosensitive Resin Composition

The photosensitive resin composition of Examples 1 to 17 and Comparative Examples 1 to 6 were prepared with the components and the amounts shown in Table 1. The amount in Table 1 is parts by mass of each component based on 100 parts by mass of the component (a).

The components used are as follows.
[Component (a)]
  Polymer I: Polymer I obtained in Production Example 1
  Polymer II: Polymer II obtained in Production Example 2
[Component (b1)]
  b1-1: Compound having the following structure (trade name "IRGACURE OXE 02" manufactured by BASF Japan Ltd.)

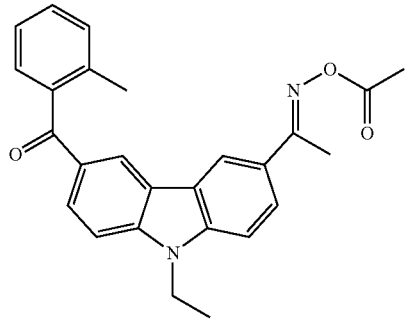 [SMILES: CCn1c2ccc(C(=O)c3ccccc3C)cc2c2cc(/C(C)=N/OC(C)=O)ccc21]

[Component (b2)]
  b2-1: Compound having the following structure (trade name "G-1820 (PDO)" manufactured by Lambson Ltd.)

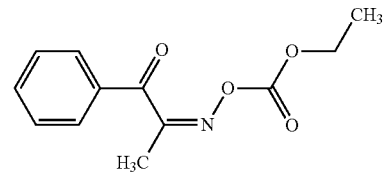 [SMILES: CCOC(=O)O/N=C(/C)C(=O)c1ccccc1]

[Component (c)]
  NMP
[Component (d)]
  d-1: Compound having the following structure (trade name "TEGDMA" manufactured by SARTOMER)

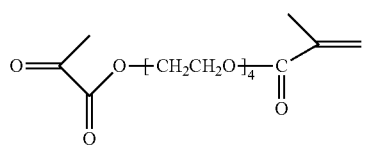

d-2: Compound having the following structure (trade name "A-TMMT" manufactured by Shin-Nakamura Chemical Co., Ltd.)

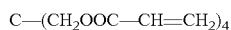

d-3: Compounds with the following structures (trade name "ATM-35E" manufactured by Shin-Nakamura Chemical Co., Ltd.)

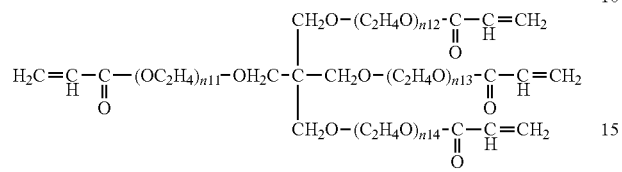

$(n11+n12+n13+n14=35)$

[Other Component]

Taobn: 1,4,4-trimethyl-2,3-diazabicyclo[3.2.2]-nona-2-ene-N,N-dixoid (trade name "Taobn" manufactured by Hampford Research, Inc.)

5ATz: Compound having the following structure (trade name "5-amino-1H-tetrazole" manufactured by Tokyo Chemical Industry Co., Ltd.)

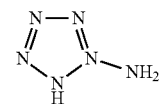

TABLE 1

| | | Photosensitive resin composition | | | | | | | | | |
|---|---|---|---|---|---|---|---|---|---|---|---|
| | | Component (a) | | Component (b1) | Component (b2) | Component (c) | Component (d) | | | Component (e) | Component (f) | Other components | |
| | | Polymer I | Polymer II | b1-1 | b2-1 | NMP | d-1 | d-2 | d-3 | e-1 | f-1 | Taobn | 5ATz |
| Examples | 1 | 100 | — | 0.5 | 4.0 | 155 | 20 | 15 | — | 0.4 | 3.0 | 0.3 | 1.0 |
| | 2 | 100 | — | 0.5 | 3.0 | 155 | 20 | 15 | — | 0.4 | 3.0 | 0.3 | 1.0 |
| | 3 | 100 | — | 0.5 | 2.0 | 155 | 20 | 15 | — | 0.4 | 3.0 | 0.3 | 1.0 |
| | 4 | 100 | — | 0.4 | 3.0 | 155 | 20 | 15 | — | 0.4 | 3.0 | 0.3 | 1.0 |
| | 5 | 100 | — | 0.4 | 2.0 | 155 | 20 | 15 | — | 0.4 | 3.0 | 0.3 | 1.0 |
| | 6 | 100 | — | 0.3 | 3.0 | 155 | 20 | 15 | — | 0.4 | 3.0 | 0.3 | 1.0 |
| | 7 | 100 | — | 0.3 | 2.0 | 155 | 20 | 15 | — | 0.4 | 3.0 | 0.3 | 1.0 |
| | 8 | 100 | — | 0.3 | 1.0 | 155 | 20 | 15 | — | 0.4 | 3.0 | 0.3 | 1.0 |
| | 9 | 100 | — | 0.2 | 3.0 | 155 | 20 | 15 | — | 0.4 | 3.0 | 0.3 | 1.0 |
| | 10 | 100 | — | 0.2 | 2.0 | 155 | 20 | 15 | — | 0.4 | 3.0 | 0.3 | 1.0 |
| | 11 | 100 | — | 0.2 | 1.0 | 155 | 20 | 15 | — | 0.4 | 3.0 | 0.3 | 1.0 |
| | 12 | 100 | — | 0.1 | 3.0 | 155 | 20 | 15 | — | 0.4 | 3.0 | 0.3 | 1.0 |
| | 13 | 100 | — | 0.1 | 2.0 | 155 | 20 | 15 | — | 0.4 | 3.0 | 0.3 | 1.0 |
| | 14 | 100 | — | 0.1 | 1.0 | 155 | 20 | 15 | — | 0.4 | 3.0 | 0.3 | 1.0 |
| | 15 | — | 100 | 0.5 | 4.0 | 120 | 20 | 10 | 10 | 0.4 | 3.0 | 0.3 | 1.0 |
| | 16 | — | 100 | 0.5 | 3.0 | 120 | 20 | 10 | 10 | 0.4 | 3.0 | 0.3 | 1.0 |
| | 17 | — | 100 | 0.5 | 2.0 | 120 | 20 | 10 | 10 | 0.4 | 3.0 | 0.3 | 1.0 |
| Comparative Examples | 1 | 100 | — | 2.0 | — | 155 | 20 | 15 | — | — | 3.0 | 0.3 | 1.0 |
| | 2 | 100 | — | 1.0 | — | 155 | 20 | 15 | — | — | 3.0 | 0.3 | 1.0 |
| | 3 | 100 | — | 0.5 | — | 155 | 20 | 15 | — | — | 3.0 | 0.3 | 1.0 |
| | 4 | 100 | — | 0.2 | — | 155 | 20 | 15 | — | — | 3.0 | 0.3 | 1.0 |
| | 5 | 100 | — | — | 9.0 | 155 | 20 | 15 | — | 0.4 | 3.0 | 0.3 | 1.0 |
| | 6 | 100 | — | — | 4.0 | 155 | 20 | 15 | — | 0.4 | 3.0 | 0.3 | 1.0 |

[Component (e)]

e-1: Compound having the following structure (trade name "EMK" manufactured by Sigma-Aldrich Corporation) (Et represents an ethyl group)

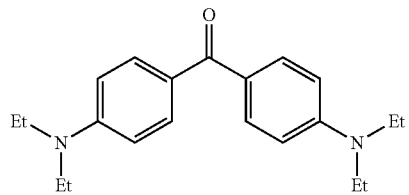 [SMILES: CCN(CC)c1ccc(C(=O)c2ccc(N(CC)CC)cc2)cc1]

[Component (f)]

f-1: γ-ureidopropyltriethoxysilane (trade name "UCT-801" manufactured by United Chemical Technologies, Inc.)

[Evaluation of Photosensitive Resin Composition]

The obtained photosensitive resin composition was used for the following evaluations.

(Manufacturing of Resin Patterns)

The obtained photosensitive resin composition was applied onto a 6-inch silicon wafer by a spin-coating method, and heated on a hot plate at 110° C. for 4 minutes to volatilize the solvent, thereby obtaining a coating film having a thickness of 13 μm. When this coating film was immersed in cyclopentanone, twice the time to complete dissolution was set as the development time. The obtained coating film was exposed at the exposure dose shown in Table 2 using an i-line stepper FPA-3000iW (manufactured by Canon Inc.) through a photomask having a square hole pattern. The exposed coating film was immersed in cyclopentanone and puddle-developed at the above development times, and then rinsed with PGMEA to obtain resin patterns.

(Evaluation of Pattern Profile)

For the resin patterns obtained in Examples 1, 2, 5, 7, 8, 10, and 13 and Comparative Examples 2 to 6, the cross-sectional shape (pattern profile) was observed by a scanning electron microscope, and the taper angle of the pattern with respect to the substrate was obtained by measuring the inclination at the midpoint of the taper. The results are shown in Table 2. The parts by mass of each of the components (b1) and (b2) based on the component (a) are shown in Table 2.

A scanning microscope photograph of the pattern profile obtained in Example 1 is shown in FIG. 1. FIG. 1 shows an auxiliary line indicating the inclination at the midpoint of the taper in the pattern. The taper angle of the pattern obtained in Example 1 with respect to the substrate was 75°.

Examples and comparative examples not shown in Table 2 were not evaluated.

TABLE 2

|  | Component (b1) (parts by mass) b1-1 | Component (b2) (parts by mass) b2-1 | Pattern profile (taper angle of the pattern) | Exposure dose (mJ/cm$^2$) |
|---|---|---|---|---|
| Ex. 1 | 0.5 | 4.0 | 75° | 500 |
| Ex. 2 | 0.5 | 3.0 | 68° | 500 |
| Ex. 5 | 0.4 | 2.0 | 81° | 300 |
| Ex. 7 | 0.3 | 2.0 | 80° | 300 |
| Ex. 8 | 0.3 | 1.0 | 79° | 500 |
| Ex. 10 | 0.2 | 2.0 | 79° | 500 |
| Ex. 13 | 0.1 | 2.0 | 77° | 800 |
| Comp. Ex. 2 | 1.0 | — | 80° | 100 |
| Comp. Ex. 3 | 0.5 | — | 72° | 200 |
| Comp. Ex. 4 | 0.2 | — | 48° | 500 |
| Comp. Ex. 5 | — | 9.0 | 79° | 300 |
| Comp. Ex. 6 | — | 4.0 | 77° | 600 |

From Comparative Examples 2 to 4, it was found that the pattern profile can be adjusted by using only a high-sensitivity photosensitive agent (b1-1). However, the taper angle of the pattern rapidly changes due to a slight change in the addition amount, and it is difficult to strictly adjust the angle. Further, as will be described later, when the amount of the photosensitive agent added is increased, the applicable range of the exposure dose is decreased, and there is a disadvantage that the handleability of the photosensitive resin composition is decreased.

In addition, from Comparative Examples 5 and 6, when only a standard-sensitivity photosensitive agent (b2-1) was used, the pattern profile hardly changed even when the amount was changed.

On the other hand, in the photosensitive resin composition of the invention, since a high-sensitivity photosensitive agent and a standard-sensitivity photosensitive agent are used in combination, the taper angle can be easily adjusted by appropriately adjusting the addition amount and the mixing ratio. In addition, the change of the pattern profile with the increase or decrease of the addition amount was gradual, and a desired pattern profile was easily obtained.

(Resolution)

The obtained photosensitive resin composition was applied onto a 6-inch silicon wafer by a spin-coating method, and heated on a hot plate at 110° C. for 4 minutes to volatilize the solvent, thereby obtaining a coating film having a thickness of 13 μm. When this coating film was immersed in cyclopentanone, twice the time to complete dissolution was set as the development time. The resulting coating was exposed in 100 mJ/cm$^2$ increment at 100 mJ/cm$^2$ to 1100 mJ/cm$^2$ using an i-line stepper FPA-3000iW (manufactured by Canon Inc.) via a photomask, soaked in cyclopentanone to paddle-develop, rinse-washed with PGMEA, and resin patterns were obtained.

The minimum value of the mask dimension of the square hole pattern which was resolved (developed) was regarded as the resolution (μm), and was evaluated according to the following criteria. The results are shown in Table 3. The parts by mass of each of the components (b1) and (b2) based on the component (a) are shown in Table 3.

A: Resolution is 10 μm or less
B: Resolution is more than 10 μm and 15 μm or less
C: Resolution is more than 15 μm and 30 μm or less
D: Resolution is more than 30 μm

TABLE 3

|  | Component (b1) b1-1 (parts by mass) | Component (b2) b2-1 (parts by mass) | Exposure dose | | | | | | | | | | |
|---|---|---|---|---|---|---|---|---|---|---|---|---|---|
|  |  |  | 100 mJ/cm$^2$ | 200 mJ/cm$^2$ | 300 mJ/cm$^2$ | 400 mJ/cm$^2$ | 500 mJ/cm$^2$ | 600 mJ/cm$^2$ | 700 mJ/cm$^2$ | 800 mJ/cm$^2$ | 900 mJ/cm$^2$ | 1000 mJ/cm$^2$ | 1100 mJ/cm$^2$ |
| Ex. 1 | 0.5 | 4.0 | A | A | A | A | B | C | C | D | D | D | D |
| Ex. 2 | 0.5 | 3.0 | A | A | A | A | B | C | C | D | D | D | D |
| Ex. 3 | 0.5 | 2.0 | A | A | A | A | B | B | C | C | D | D | D |
| Ex. 4 | 0.4 | 3.0 | A | A | A | A | B | B | C | C | C | C | C |
| Ex. 5 | 0.4 | 2.0 | A | A | A | A | A | B | B | C | C | C | C |
| Ex. 6 | 0.3 | 3.0 | A | A | A | A | A | A | B | B | C | C | C |
| Ex. 7 | 0.3 | 2.0 | A | A | A | A | B | B | B | B | B | B | B |
| Ex. 8 | 0.3 | 1.0 | B | A | A | A | A | A | A | A | A | A | B |
| Ex. 9 | 0.2 | 3.0 | B | A | A | A | A | A | A | A | B | B | B |
| Ex. 10 | 0.2 | 2.0 | C | A | A | A | A | A | A | A | A | A | A |

TABLE 3-continued

| | Component (b1) b1-1 | Component (b2) b2-1 | Exposure dose | | | | | | | | | | |
|---|---|---|---|---|---|---|---|---|---|---|---|---|---|
| | (parts by mass) | (parts by mass) | 100 mJ/cm² | 200 mJ/cm² | 300 mJ/cm² | 400 mJ/cm² | 500 mJ/cm² | 600 mJ/cm² | 700 mJ/cm² | 800 mJ/cm² | 900 mJ/cm² | 1000 mJ/cm² | 1100 mJ/cm² |
| Ex. 11 | 0.2 | 1.0 | C | A | A | A | A | A | A | A | A | A | A |
| Ex. 12 | 0.1 | 3.0 | C | A | A | A | A | A | A | A | A | A | A |
| Ex. 13 | 0.1 | 2.0 | D | B | A | A | A | A | A | A | A | A | A |
| Ex. 14 | 0.1 | 1.0 | C | B | A | A | A | A | A | A | A | A | A |
| Ex. 15 | 0.5 | 4.0 | C | A | A | A | B | C | D | D | D | D | D |
| Ex. 16 | 0.5 | 3.0 | C | A | A | A | A | B | C | C | D | D | D |
| Ex. 17 | 0.5 | 2.0 | C | A | A | A | A | B | B | C | C | D | D |
| Comp. Ex. 1 | 2.0 | — | A | C | D | D | D | D | D | D | D | D | D |
| Comp. Ex. 2 | 1.0 | — | A | B | D | D | D | D | D | D | D | D | D |
| Comp. Ex. 3 | 0.5 | — | A | A | A | C | D | D | D | D | D | D | D |
| Comp. Ex. 4 | 0.2 | — | D | B | A | A | A | A | A | B | B | C | C |
| Comp. Ex. 5 | — | 9.0 | D | A | A | A | A | A | A | A | B | B | B |
| Como. Ex. 6 | — | 4.0 | D | C | A | A | A | A | A | A | A | A | A |

From Comparative Examples 1 to 4, when only the high-sensitivity photosensitive agent (b1-1) was used, the range of exposure dose (referred to as the "optimal exposure dose range") in which high resolution of 10 μm or less was obtained was small. In particular, the optimal exposure dose ranges when the addition amount was large were very narrow and the handleability of the photosensitive resin composition were low (Comparative Examples 1 to 3).

On the other hand, in the photosensitive resin composition of the invention, by using a high-sensitivity photosensitive agent and a standard-sensitivity photosensitive agent in combination, the optimal exposure dose ranges are larger than when only the same amount of the high-sensitivity photosensitive agent is used. For example, the optimal exposure dose range when only 0.2 parts by mass of the component (b1) was used was 300 to 700 mJ/cm² (Comparative Example 4), whereas the optimal exposure dose range when the component (b2) was used in addition to the same amount of the component (b1) was at least 200 to 800 mJ/cm² (Example 9), and the maximum was 200 to 1100 mJ/cm² (Example 11), which greatly improved the handleability. The optimal exposure dose range of Example 15 is 200 to 400 mJ/cm², which is attributed to the properties of Polymer II, and it is considered that the optimal exposure dose range when only the component (b1) is combined with Polymer II is even smaller.

In addition, it was found that when the amount of the component (b1) was 0.3 parts by mass or less, the optimal exposure dose range reached a certain level or more, so that the handleability of the photosensitive resin composition was excellent.

(Manufacturing of Cured Pattern)

The resin pattern developed by the above evaluation of resolution was heated and cured under a nitrogen atmosphere at 225° C. for 1 hour using a vertical diffusion furnace (manufactured by Koyo Lindberg Co., Ltd.) to obtain a cured pattern. A good cure pattern was obtained.

(Residual Film Ratio after Development)

The residual film ratio after development was calculated from the film thickness before development (13 μm) and the film thickness after development by the following formula for the resin pattern developed by the above evaluation of resolution, and the residual film ratio was evaluated according to the following criteria. The results are shown in Table 4. The parts by mass of each of the components (b1) and (b2) relative to the component (a) are shown in Table 4.

Residual film ratio after development (%)=(film thickness after development/film thickness before development)×100

The film thickness was measured by an optical interferometer "Lambda Ace VM-2210" (manufactured by Dainippon Screen Mfg. Co., Ltd.). The film thickness after development was measured for the portion of the resin pattern where no pattern was formed.

A: Residual film ratio after development is 85% or more

B: Residual film ratio after development is 80% or more and less than 85%

C: Residual film ratio after development is less than 80%

TABLE 4

| | Component (b1) b1-1 | Component (b2) b2-1 | Exposure dose | | | | | | | | | | |
|---|---|---|---|---|---|---|---|---|---|---|---|---|---|
| | (parts by mass) | (parts by mass) | 100 mJ/cm² | 200 mJ/cm² | 300 mJ/cm² | 400 mJ/cm² | 500 mJ/cm² | 600 mJ/cm² | 700 mJ/cm² | 800 mJ/cm² | 900 mJ/cm² | 1000 mJ/cm² | 1100 mJ/cm² |
| Ex. 1 | 0.5 | 4.0 | A | A | A | A | A | A | A | A | A | A | A |
| Ex. 2 | 0.5 | 3.0 | A | A | A | A | A | A | A | A | A | A | A |
| Ex. 3 | 0.5 | 2.0 | A | A | A | A | A | A | A | A | A | A | A |
| Ex. 4 | 0.4 | 3.0 | A | A | A | A | A | A | A | A | A | A | A |
| Ex. 5 | 0.4 | 2.0 | B | A | A | A | A | A | A | A | A | A | A |
| Ex. 6 | 0.3 | 3.0 | C | A | A | A | A | A | A | A | A | A | A |
| Ex. 7 | 0.3 | 2.0 | C | A | A | A | A | A | A | A | A | A | A |
| Ex. 8 | 0.3 | 1.0 | C | B | A | A | A | A | A | A | A | A | A |
| Ex. 9 | 0.2 | 3.0 | C | B | B | A | A | A | A | A | A | A | A |
| Ex. 10 | 0.2 | 2.0 | C | B | B | A | A | A | A | A | A | A | A |

TABLE 4-continued

| | Component (b1) b1-1 | Component (b2) b2-1 | Exposure dose | | | | | | | | | | |
|---|---|---|---|---|---|---|---|---|---|---|---|---|---|
| | (parts by mass) | (parts by mass) | 100 mJ/cm² | 200 mJ/cm² | 300 mJ/cm² | 400 mJ/cm² | 500 mJ/cm² | 600 mJ/cm² | 700 mJ/cm² | 800 mJ/cm² | 900 mJ/cm² | 1000 mJ/cm² | 1100 mJ/cm² |
| Ex. 11 | 0.2 | 1.0 | C | C | C | C | B | B | B | B | B | B | A |
| Ex. 12 | 0.1 | 3.0 | C | C | B | B | A | A | A | A | A | A | A |
| Ex. 13 | 0.1 | 2.0 | C | C | C | B | B | B | A | A | A | A | A |
| Ex. 14 | 0.1 | 1.0 | — | C | C | C | C | C | C | C | C | B | B |
| Ex. 15 | 0.5 | 4.0 | A | A | A | A | A | A | A | A | A | A | A |
| Ex. 16 | 0.5 | 3.0 | A | A | A | A | A | A | A | A | A | A | A |
| Ex. 17 | 0.5 | 2.0 | A | A | A | A | A | A | A | A | A | A | A |
| Comp. Ex. 1 | 2.0 | — | A | A | A | A | A | A | A | A | A | A | A |
| Comp. Ex. 2 | 1.0 | — | A | A | A | A | A | A | A | A | A | A | A |
| Comp. Ex. 3 | 0.5 | — | B | B | B | B | A | A | A | A | A | A | A |
| Comp. Ex. 4 | 0.2 | — | C | C | C | C | C | C | C | C | C | C | C |
| Comp. Ex. 5 | — | 9.0 | C | C | B | A | A | A | A | A | A | A | A |
| Como. Ex. 6 | — | 4.0 | C | C | C | C | B | B | A | A | A | A | A |

From Table 4, it can be seen that the Examples in which the component (b1) and the component (b2) are used in combination has a wide exposure dose range in which a high residual film ratio of 80% or more can be obtained, as compared with the Comparative Examples in which only the same amount of the component (b1) is used. In addition, when the component (b1) is 0.3 parts by mass or more based on 100 parts by mass of the component (a), it is understood that the exposure dose range in which a high residual film ratio can be obtained is wider as compared with the case of 0.2 parts by mass.

INDUSTRIAL APPLICABILITY

The photosensitive resin composition of the invention can be suitably used as a protective film material or a patterned film forming material for electronic components such as semiconductors.

While some embodiments and/or examples of the invention have been described in detail above, those skilled in the art will readily make many changes to these illustrative embodiments and/or examples without materially departing from the novel teachings and advantages of the invention. Accordingly, many of these modifications are within the scope of the invention.

The entire contents of the description of the Japanese application serving as a basis of claiming the priority concerning the present application to the Paris Convention are incorporated by reference herein.

The invention claimed is:

1. A photosensitive resin composition comprising the following component (a), component (b1), and component (b2):
   (a) a polyimide precursor having a structural unit represented by the following formula (1)
   (b1) one or more compounds selected from the group consisting of a compound represented by the following formula (11) and a compound represented by the following formula (12)
   (b2) one or more compounds represented by the following formula (21)

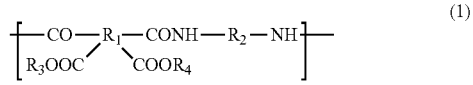

(1)

wherein in the formula (1), $R_1$ is a tetravalent organic group, $R_2$ is a divalent organic group, and $R_3$ and $R_4$ are independently a hydrogen atom, an alkyl group, a cycloalkyl group, or a monovalent organic group having a carbon-carbon unsaturated double bond;

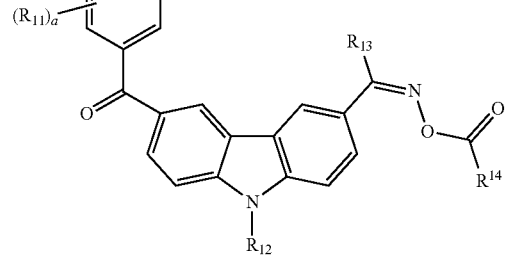

(11)

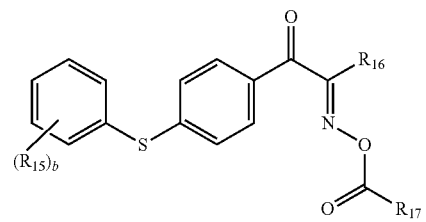

(12)

wherein in the formula (11), $R_{11}$ is an alkyl group having 1 to 12 carbon atoms, a is an integer of 0 to 5, R12 is a hydrogen atom or an alkyl group having 1 to 12 carbon atoms, and $R_{13}$ and $R_{14}$ independently represent a hydrogen atom, an alkyl group having 1 to 12 carbon atoms, a phenyl group, or a tolyl group;

wherein in the formula (12), $R_{15}$ is —OH, —COOH, —O(CH$_2$)OH, —O(CH$_2$)$_2$OH, —COO(CH$_2$)OH, or —COO(CH$_2$)$_2$OH, $R_{16}$ and $R_{17}$ are independently a hydrogen atom, an alkyl group having 1 to 12 carbon atoms, a cycloalkyl group having 4 to 10 carbon atoms, a phenyl group, or a tolyl group, and b is an integer from 0 to 5;

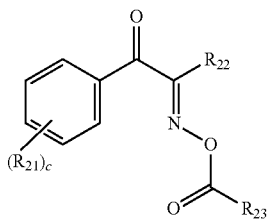

wherein in the formula (21), $R_{21}$ is an alkyl group having 1 to 12 carbon atoms, $R_{22}$ and $R_{23}$ are independently a hydrogen atom, an alkyl group having 1 to 12 carbon atoms, an alkoxy group having 1 to 12 carbon atoms, a cycloalkyl group having 4 to 10 carbon atoms, a phenyl group or a tolyl group, and c is an integer of 0 to 5.

2. The photosensitive resin composition according to claim 1, wherein the component (b1) is a compound represented by the formula (11).

3. The photosensitive resin composition according to claim 1, wherein the amount of the component (b1) is 0.05 to 5.0 parts by mass based on 100 parts by mass of the component (a) and the amount of the component (b2) is 0.5 to 10.0 parts by mass based on 100 parts by mass of the component (a).

4. The photosensitive resin composition according to claim 1, wherein the amount of the component (b1) is 0.05 to 1.0 parts by mass based on 100 parts by mass of the component (a).

5. The photosensitive resin composition according to claim 1, wherein the amount of the component (b1) is 0.15 to 0.60 parts by mass based on 100 parts by mass of the component (a).

6. The photosensitive resin composition according to claim 1, wherein the amount of the component (b2) is 0.5 to 5.0 parts by mass based on 100 parts by mass of the component (a).

7. The photosensitive resin composition according to claim 1, wherein the mass ratio of the amount of the component (b1) to the amount of the component (b2) is 1:3 to 1:30.

8. The photosensitive resin composition according to claim 1, further comprising (d) a cross-linking agent.

9. The photosensitive resin composition according to claim 1, further comprising (e) a sensitizer.

10. A method for manufacturing a cured pattern comprising:
    applying the photosensitive resin composition according to claim 1 on a substrate and drying to form a coating film,
    obtaining a resin pattern by irradiating the coating film with an active light and then developing the coating film,
    heat-treating the resin pattern.

11. A cured product obtained by curing the photosensitive resin composition according to claim 1.

12. An interlayer insulating film, a cover coat layer or a surface protective film manufactured by using the cured product according to claim 11.

13. An electronic component comprising the interlayer insulating film, the cover coat layer or the surface protective film according to claim 12.

* * * * *